US012660569B2

(12) United States Patent
Amano et al.

(10) Patent No.: US 12,660,569 B2
(45) Date of Patent: Jun. 16, 2026

(54) CERAMIC SUSCEPTOR

(71) Applicant: NGK INSULATORS, LTD., Nagoya City (JP)

(72) Inventors: Shingo Amano, Chita-Gun (JP); Masaki Ishikawa, Handa City (JP)

(73) Assignee: NGK INSULATORS, LTD., Nagoya (JP)

( * ) Notice: Subject to any disclaimer, the term of this patent is extended or adjusted under 35 U.S.C. 154(b) by 388 days.

(21) Appl. No.: 18/340,942

(22) Filed: Jun. 26, 2023

(65) Prior Publication Data

US 2024/0243002 A1 Jul. 18, 2024

Related U.S. Application Data

(63) Continuation of application No. PCT/JP2023/001014, filed on Jan. 16, 2023.

(51) Int. Cl.
H10P 72/76 (2026.01)
C23C 14/50 (2006.01)
(Continued)

(52) U.S. Cl.
CPC .......... H10P 72/7624 (2026.01); C23C 14/50 (2013.01); C23C 16/4581 (2013.01);
(Continued)

(58) Field of Classification Search
CPC ................ C23C 14/50; C23C 16/4583; H01J 37/32715; H10P 72/7624
(Continued)

(56) References Cited

U.S. PATENT DOCUMENTS 11,908,725 B2 2/2024 Choi et al.
2019/0355556 A1 11/2019 Takahashi
(Continued)

FOREIGN PATENT DOCUMENTS

JP 2003-163259 A 6/2003
JP 2020-021781 A 2/2020
(Continued)

OTHER PUBLICATIONS

Korean Office Action (Application No. 10-2023-7024650) dated Oct. 15, 2024 (with English translation) (11 pages).
(Continued)

*Primary Examiner* — John J Brayton
(74) *Attorney, Agent, or Firm* — BURR PATENT LAW, PLLC

(57) ABSTRACT
There is provided a ceramic susceptor where a conduction failure due to defective connection of inner electrodes is unlikely to occur. The ceramic susceptor includes a ceramic susceptor main body including a first surface for a wafer to be placed thereon, and a second surface opposite the first surface; an inner electrode that is embedded in the ceramic susceptor main body; and a terminal having one end connected to the inner electrode and another end reaching the second surface of the ceramic susceptor main body. The inner electrode includes a horizontal portion provided in parallel with the first surface, and a non-horizontal portion extending from the horizontal portion toward the first surface or the second surface. The horizontal portion and the non-horizontal portion are integrally formed by bending one electrode such that a bent portion that forms a boundary between the horizontal portion and the non-horizontal portion is present.

14 Claims, 3 Drawing Sheets

(51) Int. Cl.
    *C23C 16/458*       (2006.01)
    *H01J 37/32*        (2006.01)

(52) U.S. Cl.
    CPC .... *C23C 16/4586* (2013.01); *H01J 37/32541*
                (2013.01); *H01J 37/32715* (2013.01)

(58) Field of Classification Search
    USPC ................................................ 118/500, 728
    See application file for complete search history.

(56)               References Cited

U.S. PATENT DOCUMENTS

2020/0219755 A1\*   7/2020   Akatsuka ............ H01L 21/6831
2020/0388469 A1   12/2020   Kim
2022/0301916 A1\*   9/2022   Choi ....................... C23C 14/50

FOREIGN PATENT DOCUMENTS

| JP | 6754890 | B2 | 9/2020 | |
|----|---------|-----|--------|--|
| JP | 2020-202372 | A | 12/2020 | |
| KR | 10-2021-0016929 | A | 2/2021 | |
| WO | WO-2021025287 | A1 \* | 2/2021 | ............. H05B 3/283 |

OTHER PUBLICATIONS

English translation of the International Search Report and Written Opinion dated Mar. 14, 2023 (Application No. PCT/JP2023/001014).
International Search Report and Written Opinion dated Mar. 14, 2023 (Application No. PCT/JP2023/001014).

\* cited by examiner

CERAMIC SUSCEPTOR

CROSS-REFERENCE TO RELATED APPLICATION

This application is a continuation application of PCT/JP2023/001014 filed Jan. 16, 2023, the entire contents of which are incorporated herein by reference.

BACKGROUND OF THE INVENTION

1. Field of the Invention

The present invention relates to a ceramic susceptor.

2. Description of the Related Art

As a ceramic susceptor for a semiconductor manufacturing device, there is known a ceramic susceptor with an embedded inner electrode, which has a structure where an electrode spread out in a horizontal direction and an electrode extending in a vertical direction are electrically connected to each other.

Patent Literature 1 (JP2003-163259A) discloses a ceramic component where an inner electrode is embedded in a main body portion made of ceramics, the inner electrode including a first electrode piece and a second electrode piece that are separated from each other in a thickness direction inside the main body portion and that are connected by a coil-shaped conductive member.

Patent Literature 2 (JP6754890B) discloses a wafer support table where an RF electrode and a heater electrode are embedded inside a circular-plate-shaped ceramic substrate. The RF electrode is constituted by a plurality of RF zone electrodes provided on an identical plane, and includes a first RF zone electrode provided inside a predetermined circle and a second RF zone electrode provided on an outer side of the circle. The second RF zone electrode is connected to a conductor for second RF zone electrode through a jumper, and upper ends of inner terminals are connected to two points on a bottom surface of the second RF zone electrode. The jumper is an electrically conductive band-shaped mesh sheet that is parallel with a wafer placing surface.

Patent Literature 3 (JP2020-202372A) discloses a ceramic structure having a structure including a first conductive structure and a second conductive structure that are electrically connected to each other by an electrically conductive connection member capable of compensating for a vertical shrinkage rate of a ceramic sheet.

CITATION LIST

Patent Literature

Patent Literature 1: JP2003-163259A
Patent Literature 2: JP6754890B
Patent Literature 3: JP2020-202372A

SUMMARY OF THE INVENTION

A conventional inner electrode, as disclosed in Patent Literatures 1 to 3, that is embedded in a ceramic susceptor has a structure where a horizontal electrode provided in a horizontal direction and a vertical electrode provided in a vertical direction are connected to each other. However, with such a conventional inner electrode, the horizontal electrode and the vertical electrode are joined, and there is a problem that a conduction failure may occur due to defective connection.

The present inventors have now found that by adopting an inner electrode that includes a horizontal portion and a non-horizontal portion that are integrally formed by bending one electrode, it is possible to provide a ceramic susceptor where a conduction failure due to defective connection of inner electrodes is unlikely to occur.

Accordingly, an object of the present invention is to provide a ceramic susceptor where a conduction failure due to defective connection of inner electrodes is unlikely to occur.

The present invention provides the following aspects:

[Aspect 1] A ceramic susceptor comprising:

a ceramic susceptor main body including a first surface for a wafer to be placed thereon, and a second surface opposite the first surface;

an inner electrode that is embedded in the ceramic susceptor main body; and a terminal having one end connected to the inner electrode and another end reaching the second surface of the ceramic susceptor main body, wherein the inner electrode includes a horizontal portion provided in parallel with the first surface and a non-horizontal portion extending from the horizontal portion toward the first surface or the second surface, and the horizontal portion and the non-horizontal portion are integrally formed by bending one electrode such that a bent portion that forms a boundary between the horizontal portion and the non-horizontal portion is present.

[Aspect 2] The ceramic susceptor according to Aspect 1, wherein the inner electrode is composed of one metal mesh.

[Aspect 3] The ceramic susceptor according to Aspect 1 or 2, wherein an angle formed by the horizontal portion and the non-horizontal portion at the bent portion is from 50° to 130°.

[Aspect 4] The ceramic susceptor according to any one of Aspects 1 to 3, wherein the number of non-horizontal portion is from 1 to 100.

[Aspect 5] The ceramic susceptor according to any one of Aspects 1 to 4, wherein the ceramic susceptor main body is made of aluminum nitride and/or aluminum oxide.

[Aspect 6] The ceramic susceptor according to any one of Aspects 1 to 5, wherein the one electrode includes an electrode main part that has a circular disk shape, and an extending portion that extends from the electrode main part, the electrode main part forming the horizontal portion, the extending portion being bent to form the non-horizontal portion.

[Aspect 7] The ceramic susceptor according to any one of Aspects 1 to 6, wherein the one electrode includes an electrode main part that has a circular disk shape, and an extending portion that extends from the electrode main part, wherein a pair of slits are formed at a part, of the electrode main part, corresponding to a root of the extending portion, the pair of slits being for enabling bending inside an outer periphery of the electrode main part, and wherein the one electrode is bent inside the electrode main part in a manner to include a root portion sectioned by the pair of slits such that the extending portion and the root portion form the non-horizontal portion and a remaining part of the electrode main part other than the root portion forms the horizontal portion.

[Aspect 8] The ceramic susceptor according to any one of Aspects 1 to 7, wherein the non-horizontal portion of the inner electrode reaches the first surface.

[Aspect 9] The ceramic susceptor according to Aspect 8, wherein the inner electrode functions as a ground electrode.

[Aspect 10] The ceramic susceptor according to Aspect 9, wherein the ceramic susceptor is for being used in an ion implantation device or a physical vapor deposition (PVD) device.

[Aspect 11] The ceramic susceptor according to any one of Aspects 1 to 7, wherein the ceramic susceptor main body includes a first layer that has a circular disk shape and that provides the first surface; and a second layer that has a circular disk shape, that has a larger diameter than a diameter of the first layer, and provides the second surface so that the second layer extends outward from an outer peripheral edge of the first layer along an outer periphery of the ceramic susceptor main body to form an outer peripheral step portion, and wherein the ceramic susceptor further comprises a second inner electrode that is embedded in the outer peripheral step portion of the second layer and that is connected to the inner electrode.

[Aspect 12] The ceramic susceptor according to Aspect 11, wherein the inner electrode includes the horizontal portion that is embedded in the first layer, and the non-horizontal portion that is embedded in the first layer and the second layer, and wherein the second inner electrode is embedded in an outer peripheral part including the outer peripheral step portion of the second layer, in parallel with the horizontal portion, and is connected to a lower end of the non-horizontal portion.

[Aspect 13] The ceramic susceptor according to Aspect 11 or 12, wherein the inner electrode and the second inner electrode are separate electrodes.

[Aspect 14] The ceramic susceptor according to Aspect 11 or 12, wherein the inner electrode and the second inner electrode are integrally formed by bending one electrode.

[Aspect 15] The ceramic susceptor according to any one of Aspects 11 to 14, wherein the ceramic susceptor is for being used in a film deposition device or an etching device that uses plasma.

DETAILED DESCRIPTION OF THE INVENTION

A ceramic susceptor according to the present invention is a ceramic table for supporting a wafer W inside a semiconductor manufacturing device. For example, the ceramic susceptor according to the present invention may be a ceramic heater for a semiconductor film deposition device, or an electrostatic chuck for a semiconductor etching device. As typical examples of the film deposition device, there may be cited CVD (chemical vapor deposition) devices (such as a thermal CVD device, a plasma CVD device, a photo-assisted CVD device, and an MOCVD device) and a PVD (physical vapor deposition) device.

Figure 1:
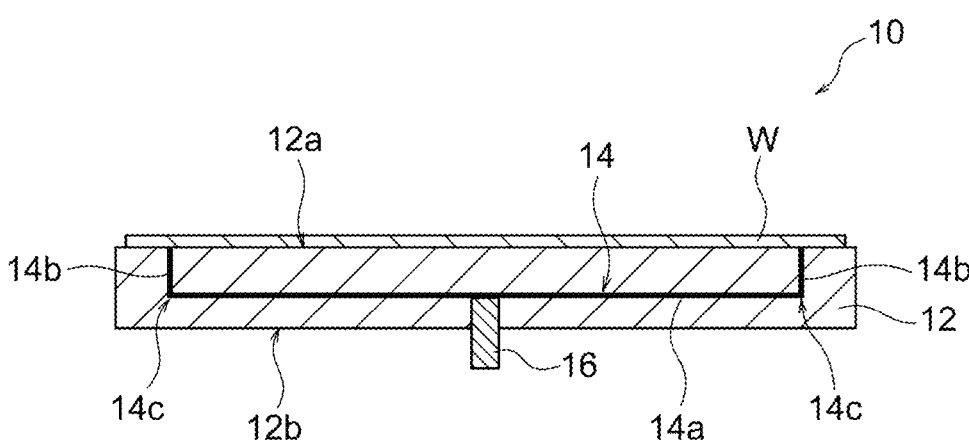
FIG. 1 is a schematic cross-sectional view showing a mode of a ceramic susceptor according to the present invention.
Figure 2:
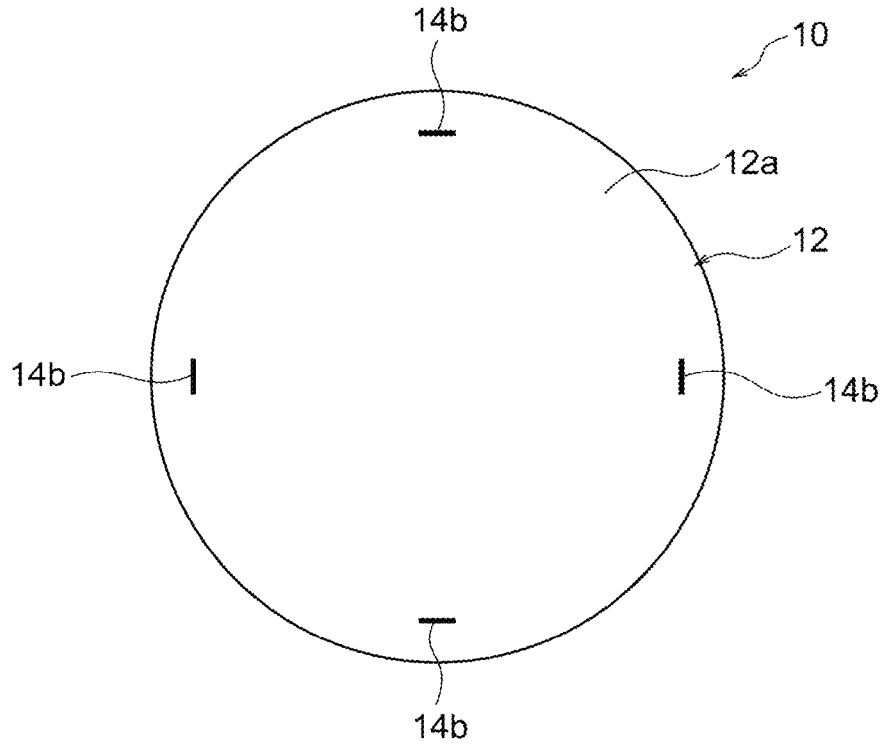
FIG. 2 is a schematic top view showing the ceramic susceptor shown in FIG. 1.

FIGS. 1 and 2 show an example of the ceramic susceptor. A ceramic susceptor 10 shown in FIGS. 1 and 2 includes a ceramic susceptor main body 12, an inner electrode 14, and a terminal 16. The ceramic susceptor main body 12 includes a first surface 12a for a wafer W to be placed thereon, and a second surface 12b opposite the first surface 12a. The inner electrode 14 is embedded in the ceramic susceptor main body 12. The terminal 16 has one end connected to the inner electrode 14 and the other end reaching the second surface 12b of the ceramic susceptor main body 12. The inner electrode 14 includes a horizontal portion 14a that is provided in parallel with the first surface 12a, and non-horizontal portions 14b that extend from the horizontal portion 14a toward the first surface 12a or the second surface 12b. The horizontal portion 14a and the non-horizontal portions 14b are integrally formed by bending one electrode, and accordingly, there are bent portions 14c that are boundaries between the horizontal portion 14a and the non-horizontal portions 14b. By adopting the inner electrode 14 including the horizontal portion 14a and the non-horizontal portions 14b that are integrally formed by bending one electrode as described above, it is possible to provide the ceramic susceptor 10 where a conduction failure due to defective connection of the inner electrode 14 is unlikely to occur.

Figure 3:
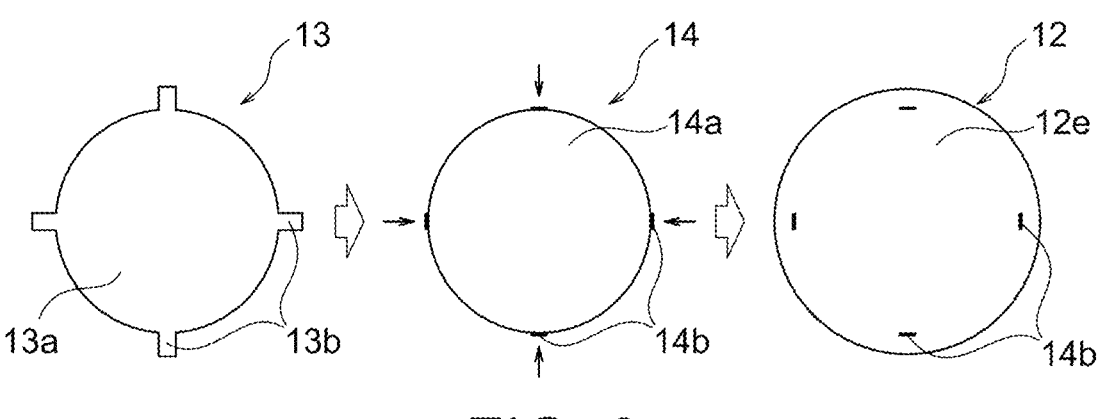
FIG. 3 is a diagram showing a process of fabricating, from one electrode, an inner electrode that is used in the ceramic susceptor shown in FIGS. 1 and 2.

As described above, with conventional susceptors as disclosed in Patent Literatures 1 to 3, an inner electrode is formed by joining a horizontal electrode and a vertical electrode, and there is a problem that a conduction failure occurs due to defective connection. The ceramic susceptor 10 of the present invention solves such a problem. That is, as shown in FIG. 3, with the inner electrode 14 adopted by the present invention, the horizontal portion 14a and the non-horizontal portions 14b are integrally formed by bend-ing one electrode 13 (particularly, extending portions 13b), and thus, the bent portion 14c that is a boundary between the horizontal portion 14a and each non-horizontal portion 14b is not formed by joining a separate electrode and is a part of one electrode 13 from the start. Accordingly, a solid struc-ture is secured at an angled boundary portion (that is, the bent portion 14c), which, in the case of a conventional configuration, would have tended to cause a defective con-nection. As a result, the defective connection is unlikely to occur.

The ceramic susceptor main body 12 is a ceramic plate that is a base material where the inner electrode 14 and the terminal 16 of the ceramic susceptor 10 are embedded, and may have a same configuration as a ceramic plate that is adopted by a known ceramic susceptor. From the standpoint of high thermal conductivity, high electrical insulation prop-erty, and thermal expansion characteristics similar to those of silicon, for example, the ceramic susceptor main body 12 is preferably made of aluminum nitride and/or aluminum oxide.

A preferable shape for the ceramic susceptor main body 12 is a circular disk shape. However, a plan-view shape of the circular disk-shaped ceramic susceptor main body 12 does not have to be a perfectly circular shape, and may be an incompletely circular shape such as orientation flat where a part is cut off, for example. A size of the ceramic susceptor main body 12 may be determined as appropriate according to a diameter of the wafer W that is expected to be used and is not particularly specified, but in the case of a circular shape, a diameter is typically 150 mm to 450 mm, and is about 300 mm, for example.

As described above, the inner electrode 14 includes the horizontal portion 14a and the non-horizontal portions 14b. As shown in FIG. 3, the horizontal portion 14a and the non-horizontal portions 14b are integrally formed by bending one electrode 13 (particularly, the extending portions 13b), and thus, the bent portions 14c exist at boundaries between the horizontal portion 14a and the non-horizontal portions 14b. One electrode 13 preferably includes an electrode main part 13a having a circular disk shape, and the extending portions 13b extending from the electrode main part 13a, where the electrode main part 13a forms the horizontal portion 14a and the extending portions 13b are bent to form the non-horizontal portions 14b.

Figure 4:
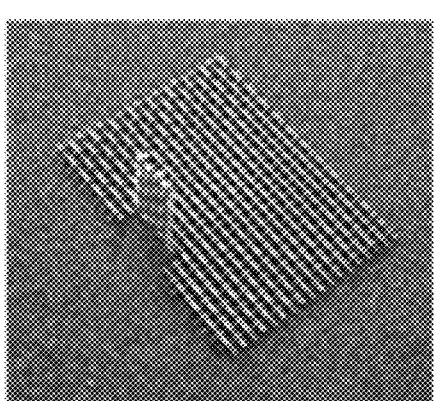
FIG. 4 is a photograph showing an example of an inner electrode including a horizontal portion and a non-horizontal portion that are integrally formed by bending a metal mesh.

The inner electrode 14 is preferably made of metal such as molybdenum or tungsten having a thermal expansion coefficient similar to that of aluminum nitride or aluminum oxide, but is not particularly limited as long as it is a bendable conductive member. More preferably, the inner electrode 14 is composed of one metal mesh as shown in FIG. 4. A metal mesh has an advantage that, at a time of fabrication of the ceramic susceptor main body 12 by calcining a green body where the inner electrode 14 is embedded, the metal mesh is able to be compressed and deformed according to contraction due to calcination. Accordingly, contraction at the time of calcination may be mitigated, and occurrence of defective connection at the bent portion 14c may be more effectively prevented.

It suffices if the metal mesh has a meshed structure where a plurality of metal wires are spread in a manner intersecting one another. A diameter (a wire diameter) of the metal wire forming the metal mesh is not particularly specified, but is preferably from 0.20 mm to 0.50 mm, more preferably from 0.25 mm to 0.45 mm, and even more preferably from 0.30 mm to 0.40 mm. An opening of the metal mesh (a dimension of a gap of the mesh) is not particularly specified, but is preferably from 0.50 mm to 0.90 mm, more preferably from 0.60 mm to 0.80 mm, and even more preferably from 0.65 mm and 0.75 mm.

The horizontal portion 14a is provided inside the ceramic susceptor main body 12, in parallel with the first surface 12a. However, the horizontal portion 14a does not have to be perfectly parallel to the first surface 12a, and may be provided approximately along a horizontal direction as long as a function of the inner electrode 14 is not impaired.

Figure 6:
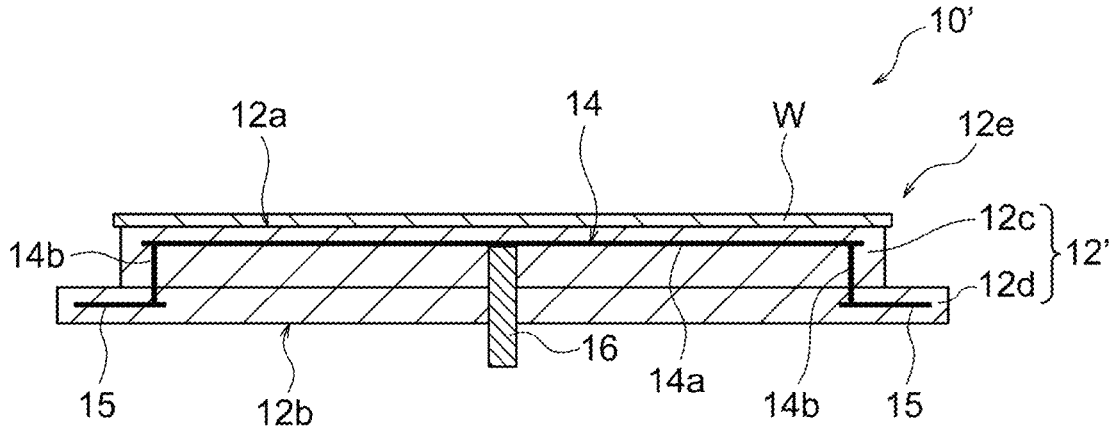
FIG. 6 is a schematic cross-sectional view showing another mode of the ceramic susceptor according to the present invention.

The non-horizontal portion 14b extends from the horizontal portion 14a toward the first surface 12a or the second surface 12b. That is, as shown in FIG. 1, the non-horizontal portion 14b may extend from the horizontal portion 14a toward the first surface 12a. Alternatively, as shown in FIG. 6 described later, the non-horizontal portion 14b may extend from the horizontal portion 14a toward the second surface 12b.

An angle formed by the horizontal portion 14a and the non-horizontal portion 14b at the bent portion 14c is preferably from 50° to 130°, more preferably from 60° to 120°, even more preferably from 70° to 110°, even more preferably from 80° to 100°, and most preferably from 85° to 95°, such as 90°. That is, the non-horizontal portion 14b is most desirably a so-called vertical electrode. When the angle is within the ranges mentioned above, the electrode 13 is not easily damaged by bending, and a conduction failure is less likely to occur at the bent portion 14c.

The number of non-horizontal portions 14b is preferably from 1 to 100, more preferably from 2 to 40, even more preferably from 2 to 20, even more preferably from 2 to 10, and most preferably from 2 to 6, such as 4.

Figure 5:
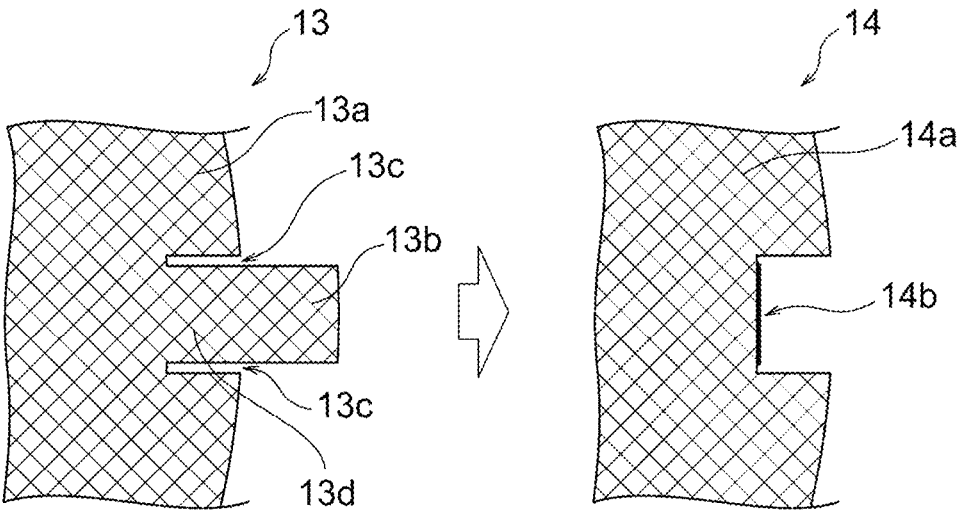
FIG. 5 is a diagram showing an example of fabricating the inner electrode from one electrode including a pair of slits.

As described above, one electrode 13 before bending may include the electrode main part 13a having a circular disk shape, and the extending portions 13b extending from the electrode main part 13a. In this case, as shown in FIG. 5, a pair of slits 13c are preferably formed at a part, of the electrode main part 13a, corresponding to a root of the extending portion 13b such that bending can be performed inside an outer periphery of the electrode main part 13a. With such a structure, one electrode 13 is preferably bent inside the electrode main part 13a in a manner to include a root portion 13d sectioned by the pair of slits 13c such that the extending portion 13b and the root portion 13d form the non-horizontal portion 14b and such that the remaining part of the electrode main part 13a other than the root portion 13d forms the horizontal portion 14a. According to such a structure, stability of the bent portion 14c may be increased compared to a case where bending is performed at or beyond an outer periphery of the electrode main part 13a or the horizontal portion 14a.

With the ceramic susceptor 10 shown in FIG. 1, the non-horizontal portion 14b of the inner electrode 14 reaches the first surface 12a. In this case, an end portion of the non-horizontal portion 14b is exposed from the first surface 12a, and thus, the non-horizontal portion 14b comes into contact with the wafer W placed on the first surface 12a, and as a result, the wafer W can be grounded or electricity can be removed therefrom through the inner electrode 14 and the terminal 16. In other words, the inner electrode 14 may be caused to function as a ground electrode. More specifically, the inner electrode 14 can be grounded through the terminal 16 by connecting one end of the terminal 16 to the inner electrode 14 (typically, the horizontal portion 14a) and by causing the other end of the terminal 16 to reach the second surface 12b of the ceramic susceptor main body 12. The ceramic susceptor 10 having such a structure that allows removal of electricity can be desirably used in an ion implantation device or a physical vapor deposition (PVD) device. However, depending on the use, the non-horizontal portion 14b of the inner electrode 14 may extend toward (without reaching) the second surface 12b (instead of the first surface 12a), as in the case of a ceramic susceptor 10' shown in FIG. 6 described later.

An outer peripheral edge portion of the ceramic susceptor main body 12 may have a flat shape as shown in FIG. 1, but may alternatively have a stepped shape as shown in FIG. 6. With the ceramic susceptor 10' shown in FIG. 6, a ceramic susceptor main body 12' includes a first layer 12c that has a circular disk shape and that provides the first surface 12a, and a second layer 12d that has a circular disk shape, that has a larger diameter than that of the first layer 12c, and that provides the second surface 12b, and thus, the second layer 12d extends outward from an outer peripheral edge of the first layer 12c along an outer periphery of the ceramic susceptor main body 12' to form an outer peripheral step portion 12e. In this case, the ceramic susceptor 10' preferably further includes a second inner electrode 15 that is embedded in the outer peripheral step portion 12e of the second layer 12d and that is connected to the inner electrode 14. For example, the inner electrode 14 includes the horizontal portion 14a that is embedded in the first layer 12c, and the non-horizontal portions 14b embedded in the first layer 12c and the second layer 12d, and the second inner electrode 15 is embedded in an outer peripheral part including the outer peripheral step portion 12e of the second layer 12d, in parallel with the horizontal portion 14a, and is connected to lower ends of the non-horizontal portions 14b. According to such a structure, uniformity of plasma in a susceptor for a film deposition device or an etching device that uses plasma may be enhanced by applying a high-frequency voltage up to an outer peripheral portion of the wafer W. In other words, the inner electrode 14 may be caused to function as an RF electrode for generating plasma. Accordingly, the ceramic susceptor 10' described above where the second inner electrode 15 is provided in the outer peripheral step portion 12e may be desirably used in a film deposition device or an etching device that uses plasma. The inner electrode 14 and the second inner electrode 15 may be separate electrodes, or may be integrally formed by bending one electrode. In either case, the second inner electrode 15 is preferably formed into a ring shape that surrounds the circular disk-shaped electrode main part 13a along an outer periphery when seen in a plan view, from the standpoint of enhancing uniformity of plasma at the outer peripheral portion of the wafer W.

As described above, one end of the terminal 16 is connected to the inner electrode 14, and the other end reaches the second surface 12b of the ceramic susceptor main body 12. Typically, the terminal 16 extends out from the second surface 12b. The terminal 16 may be made of metal such as molybdenum or nickel and is not particularly limited as long as it is a conductive member, but is preferably made of molybdenum when considering the thermal expansion coefficient.

In addition to the inner electrode 14 and the second inner electrode 15 described above, other electrodes may also be embedded in the ceramic susceptor main body 12. Examples of other electrodes include a heater electrode and an ESC electrode (an electrostatic chuck electrode).

What is claimed is:

1. A ceramic susceptor comprising:
    a ceramic susceptor main body including a first surface for a wafer to be placed thereon, and a second surface opposite the first surface;
    an inner electrode that is embedded in the ceramic susceptor main body; and
    a terminal having one end connected to the inner electrode and another end reaching the second surface of the ceramic susceptor main body,
    wherein the inner electrode includes a horizontal portion provided in parallel with the first surface and a non-horizontal portion extending from the horizontal portion toward the first surface or the second surface, and the horizontal portion and the non-horizontal portion are integrally formed by bending one electrode such that a bent portion that forms a boundary between the horizontal portion and the non-horizontal portion is present, and
    wherein the non-horizontal portion of the inner electrode reaches the first surface.

2. The ceramic susceptor according to claim 1, wherein the inner electrode is composed of one metal mesh.

3. The ceramic susceptor according to claim 1, wherein an angle formed by the horizontal portion and the non-horizontal portion at the bent portion is from 50° to 130°.

4. The ceramic susceptor according to claim 1, wherein the number of non-horizontal portion is from 1 to 100.

5. The ceramic susceptor according to claim 1, wherein the ceramic susceptor main body is made of aluminum nitride and/or aluminum oxide.

6. The ceramic susceptor according to claim 1, wherein the one electrode includes an electrode main part that has a circular disk shape, and an extending portion that extends from the electrode main part, the electrode main part forming the horizontal portion, the extending portion being bent to form the non-horizontal portion.

7. The ceramic susceptor according to claim 1,
    wherein the one electrode includes an electrode main part that has a circular disk shape, and an extending portion that extends from the electrode main part,
    wherein a pair of slits are formed at a part, of the electrode main part, corresponding to a root of the extending portion, the pair of slits being for enabling bending inside an outer periphery of the electrode main part, and
    wherein the one electrode is bent inside the electrode main part in a manner to include a root portion sectioned by the pair of slits such that the extending portion and the root portion form the non-horizontal portion and a remaining part of the electrode main part other than the root portion forms the horizontal portion.

8. The ceramic susceptor according to claim 1, wherein the inner electrode functions as a ground electrode.

9. The ceramic susceptor according to claim 8, wherein the ceramic susceptor is for being used in an ion implantation device or a physical vapor deposition (PVD) device.

10. The ceramic susceptor according to claim 1,
    wherein the ceramic susceptor main body includes a first layer that has a circular disk shape and that provides the first surface; and a second layer that has a circular disk shape, that has a larger diameter than a diameter of the first layer, and provides the second surface so that the second layer extends outward from an outer peripheral edge of the first layer along an outer periphery of the ceramic susceptor main body to form an outer peripheral step portion, and
    wherein the ceramic susceptor further comprises a second inner electrode that is embedded in the outer peripheral step portion of the second layer and that is connected to the inner electrode.

11. The ceramic susceptor according to claim 10,
    wherein the inner electrode includes the horizontal portion that is embedded in the first layer, and the non-horizontal portion that is embedded in the first layer and the second layer, and
    wherein the second inner electrode is embedded in an outer peripheral part including the outer peripheral step portion of the second layer, in parallel with the horizontal portion, and is connected to a lower end of the non-horizontal portion.

12. The ceramic susceptor according to claim 10, wherein the inner electrode and the second inner electrode are separate electrodes.

13. The ceramic susceptor according to claim 10, wherein the inner electrode and the second inner electrode are integrally formed by bending one electrode.

14. The ceramic susceptor according to claim 10, wherein the ceramic susceptor is for being used in a film deposition device or an etching device that uses plasma.

* * * * *